(12) United States Patent
Jang et al.

(10) Patent No.: US 7,671,389 B2
(45) Date of Patent: Mar. 2, 2010

(54) SRAM DEVICES HAVING BURIED LAYER PATTERNS

(75) Inventors: Jae-Hoon Jang, Gyeonggi-do (KR);
Soon-Moon Jung, Seoul (KR);
Young-Seop Rah, Gyeonggi-do (KR);
Han-Byung Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 836 days.

(21) Appl. No.: 11/385,473

(22) Filed: Mar. 21, 2006

(65) Prior Publication Data

US 2006/0216886 A1    Sep. 28, 2006

(30) Foreign Application Priority Data

Mar. 22, 2005    (KR) ............... 10-2005-0023801

(51) Int. Cl.
*H01L 31/112* (2006.01)
(52) U.S. Cl. .............. 257/278; 257/316; 257/347; 257/E21.026; 257/E25.018; 257/E27.026; 438/152; 438/158; 438/618
(58) Field of Classification Search .......... 257/74, 257/315–316, 347, E25.018, E27.026, E21.026, 257/E21.43; 438/152, 153, 154, 155, 618, 438/622
See application file for complete search history.

(56) References Cited

U.S. PATENT DOCUMENTS

| | | | | |
|---|---|---|---|---|
| 5,266,511 | A * | 11/1993 | Takao | 438/401 |
| 5,897,189 | A * | 4/1999 | Sako et al. | 349/171 |
| 6,287,913 | B1 | 9/2001 | Agnello et al. | 438/241 |
| 6,600,173 | B2 * | 7/2003 | Tiwari | 257/74 |
| 6,696,351 | B1 * | 2/2004 | Kuroda | 438/450 |
| 6,753,226 | B2 * | 6/2004 | Tsugane et al. | 438/258 |
| 6,881,621 | B2 | 4/2005 | Choe et al. | |
| 7,387,919 | B2 * | 6/2008 | Kwak et al. | 438/153 |
| 7,417,286 | B2 * | 8/2008 | Kim et al. | 257/353 |
| 2001/0028059 | A1 * | 10/2001 | Emma et al. | 257/67 |
| 2002/0119640 | A1 * | 8/2002 | Gonzalez | 438/455 |
| 2004/0144979 | A1 * | 7/2004 | Bhattacharyya | 257/67 |

(Continued)

FOREIGN PATENT DOCUMENTS

KR    10-1992-0016295    4/1994

(Continued)

*Primary Examiner*—W. David Coleman
*Assistant Examiner*—Su C Kim
(74) *Attorney, Agent, or Firm*—Myers Bigel Sibley & Sajovec (57) ABSTRACT

An SRAM device includes a substrate having at least one cell active region in a cell array region and a plurality of peripheral active regions in a peripheral circuit region, a plurality of stacked cell gate patterns in the cell array region, and a plurality of peripheral gate patterns disposed on the peripheral active regions in the peripheral circuit region. Metal silicide layers are disposed on at least one portion of the peripheral gate patterns and on the semiconductor substrate near the peripheral gate patterns, and buried layer patterns are disposed on the peripheral gate patterns and on at least a portion of the metal silicide layers and the portions of the semiconductor substrate near the peripheral gate patterns. An etch stop layer and a protective interlayer-insulating layer are disposed around the peripheral gate patterns and on the cell array region. Methods of forming an SRAM device are also disclosed.

9 Claims, 9 Drawing Sheets

U.S. PATENT DOCUMENTS

| | | |
|---|---|---|
| 2004/0173833 A1* | 9/2004 | Tsugane et al. ............. 257/296 |
| 2006/0028861 A1* | 2/2006 | Han et al. .................. 365/154 |
| 2006/0108627 A1 | 5/2006 | Choi et al. |
| 2007/0047371 A1 | 3/2007 | Park et al. |
| 2008/0023747 A1 | 1/2008 | Park et al. |
| 2008/0067517 A1 | 3/2008 | Jang et al. |
| 2008/0067573 A1 | 3/2008 | Jang et al. |
| 2008/0128780 A1 | 6/2008 | Nishihara et al. |
| 2008/0268595 A1 | 10/2008 | Lee et al. |

FOREIGN PATENT DOCUMENTS

| | | |
|---|---|---|
| KR | 10-2003-00499778 A | 6/2003 |
| KR | 10-2004-0009867 | 1/2004 |
| KR | 10-2004-0048039 | 6/2004 |

* cited by examiner

United States Patent US 7,671,389 B2

SRAM DEVICES HAVING BURIED LAYER PATTERNS

CROSS-REFERENCE TO RELATED APPLICATION

This application claims priority to Korean Application Serial No. 10-2005-0023801, filed Mar. 22, 2005, the disclosure of which is hereby incorporated herein by reference as if set forth in its entirety.

FIELD OF THE INVENTION

The present invention relates to static random access memory (SRAM) devices and methods of forming the same, and more particularly, to SRAM devices having a buried layer pattern and methods of forming the same.

BACKGROUND

In recent years, static random access memory (SRAM) devices have been fabricated having cell gate patterns sequentially stacked on an active region of a semiconductor substrate. Current in the device may be increased when the cell gate patterns are arranged in a three-dimensional manner on the semiconductor substrate, compared with a two-dimensional arrangement. In addition, sequentially stacking the cell gate patterns may provide increased device density for a given set of design rules.

However, there may be a structural limit in applying a silicide process to a peripheral circuit region of an SRAM device. This is because the cell gate patterns of an SRAM device may be disposed vertically in the cell array region, while peripheral gate patterns are disposed laterally in the peripheral circuit region. Thus, when a silicide process is performed on the peripheral gate patterns and the semiconductor substrate near the peripheral gate patterns, the silicide process may cause metal contamination in the cell gate patterns, which may degrade the electrical characteristics of the SRAM device.

U.S. Pat. No. 6,287,913 to Paul D. Agnello et al. (the '913 patent) discloses a double polysilicon process for providing both logic and memory circuits/devices in a single chip.

According to the '913 patent, a double polysilicon process includes forming a memory gate stack on a memory region. After the gate stack is formed, a logic gate stack is formed on a logic region. A silicide process is then performed on the logic region to form cobalt (Co) or titanium (Ti) silicides on a top surface of the logic gate stack and the semiconductor substrate near the logic gate stack.

However, in the polysilicon process, the memory stack and the logic gate stack are not formed at the same time. Accordingly, use of a double polysilicon process may require a lengthy fabrication process and/or may increase the cost of fabricating a semiconductor chip.

SUMMARY

A static random access memory (SRAM) device according to some embodiments of the invention includes a semiconductor substrate having at least one cell active region in a cell array region and a plurality of peripheral active regions in a peripheral circuit region, a plurality of stacked cell gate patterns in the cell array region, and a plurality of peripheral gate patterns disposed on the peripheral active regions in the peripheral circuit region. Metal silicide layers are disposed on at least one portion of the peripheral gate patterns and on portions of the semiconductor substrate near the peripheral gate patterns, respectively, and buried layer patterns are disposed on the peripheral gate patterns and on at least a portion of the metal suicide layers and the portions of the semiconductor substrate near the peripheral gate patterns. An etch stop layer and a protective interlayer-insulating layer are disposed around the peripheral gate patterns and on the cell array region. The protective interlayer-insulating later and the etch stop layer surround the buried layer patterns.

The protective interlayer-insulating layer may include at least two insulating layers disposed between the cell gate patterns in the cell array region and between the peripheral active regions in the peripheral circuit region.

The cell array region may further include first and second body regions sequentially stacked above the at least one cell active region. The first and second body regions may have the same conductivity type as the at least one cell active region. One of the cell gate patterns is formed on the at least one cell active region, and the remaining cell gate patterns are formed on the first and second body regions, respectively.

An SRAM device may further include source and drain regions disposed in the at least one cell active region and the first and second body regions. The source and drain regions overlap the cell gate patterns.

An SRAM device according to some embodiments of the invention may further include a first landing pad disposed between the at least one cell active region and the first body region in the cell array region, and a second landing pad disposed between the first body region and the second body region in the cell array region. The first landing pad may be in contact with at least one of the source and/or drain regions in the at least one cell active region, and the second landing pad may be in contact with at least one of the source and/or drain regions in the first body region.

An SRAM device may further include source and drain regions disposed in the peripheral active regions of the peripheral circuit region. The source and drain regions in the peripheral active regions overlap the peripheral gate patterns, and portions of the source and drain regions in the peripheral active regions are on the metal silicide layers in the semiconductor substrate.

A static random access memory (SRAM) device according to further embodiments of the invention includes a semiconductor substrate having at least one cell active region in a cell array region and a plurality of peripheral active regions in a peripheral circuit region, a plurality of cell gate patterns sequentially stacked on the active region in the cell array region, a plurality of peripheral gate patterns formed on the active regions in the peripheral circuit region, and metal silicide layers disposed on at least one portion of the peripheral gate patterns and on the semiconductor substrate near the at least one portion of the peripheral gate patterns, respectively. Etching protective layer patterns and buried layer patterns are disposed on the at least one portion of the peripheral gate patterns and at least partially on the metal silicide layers and the semiconductor substrate, and an etch stop layer and a protective interlayer-insulating layer are disposed on the cell array region and on regions around the at least one portion of the peripheral gate patterns. The protective interlayer-insulating layer and the etch stop layer surround the buried layer patterns and the etching protective layer patterns, and the etching protective layer patterns are disposed between the buried layer patterns and the protective interlayer-insulating layer, and extend away from a surface of the semiconductor substrate.

The protective interlayer-insulating layer may include at least two insulating layers interposed between the cell gate patterns in the cell array region and disposed between the peripheral active regions in the peripheral circuit region.

The cell array region further may include first and second body regions stacked above the at least one cell active region. The first and second body regions may have the same conductivity type as the active region. One of the cell gate patterns is formed on the at least one cell active region, and the remaining cell gate patterns are formed on the first and second body regions, respectively.

An SRAM device according to some embodiments of the invention may further include source and drain regions disposed in the at least one cell active region and the body regions in the cell array region. The source and drain regions of the at least one cell active region and the body regions overlap the cell gate patterns.

An SRAM device may further include a first landing pad disposed between the at least one cell active region and the first body region in the cell array region, and a second landing pad disposed between the first body region and the second body region in the cell array region. The first landing pad may be in contact with a source and/or drain region in the at least one cell active region and the second landing pad may be in contact with a source and/or drain region in the first body region in the cell array region.

An SRAM device may further include source and drain regions disposed in the peripheral active regions in the peripheral circuit region. The source and drain regions overlap the peripheral gate patterns, and portions of the source and drain regions cover the metal silicide layers in the semiconductor substrate.

Methods of forming a static random access memory (SRAM) device according to some embodiments of the invention include providing a semiconductor substrate having at least one cell active region in a cell array region and a plurality of peripheral active regions in a peripheral circuit region, forming cell gate patterns sequentially stacked on at least one cell active region in the cell array region and peripheral gate patterns on the peripheral active regions in the peripheral circuit region, forming an etch stop layer on the peripheral gate patterns and a portion of the cell gate patterns, and forming a protective interlayer-insulating layer on the etch stop layer. The protective interlayer-insulating layer may isolate the cell gate patterns from each other. At least one portion of the peripheral gate patterns and the semiconductor substrate near the at least one portion of the peripheral gate patterns are exposed, and metal silicide layers are formed on the at least one portion of the peripheral gate patterns and on the semiconductor substrate near the at least one portion of the peripheral gate patterns, respectively. Buried layer patterns are formed on the metal silicide layers.

Forming the buried layer patterns may include forming a buried layer on the protective interlayer-insulating layer and the at least one portion of the peripheral gate patterns, and performing a planarization process on the buried layer until the protective interlayer-insulating layer is exposed. A distance between a top surface of the buried layer and a top surface of the protective interlayer-insulating layer in the peripheral circuit region is larger than a distance between top surfaces of two cell gate patterns facing each other in the cell array region.

Forming the metal silicide layers may include forming a metal layer on at least one portion of the peripheral gate patterns and the semiconductor substrate near the at least one portion of the peripheral gate patterns, and performing a silicide process on the metal layer.

The metal layer may include nickel (Ni) and/or cobalt (Co).

Forming the metal silicide layers may include sequentially forming a metal layer and a metal protective layer on the at least one portion of the peripheral gate patterns and the semiconductor substrate near the at least one portion of the peripheral gate patterns, and performing a silicide process on the metal protective layer.

The metal layer may include nickel (Ni) and/or cobalt (Co). The metal protective layer may include titanium nitride (TiN).

Exposing the at least one portion of the peripheral gate patterns may include forming photoresist patterns on the protective interlayer-insulating layer, performing an etching process on the protective interlayer-insulating layer and the etch stop layer using the photoresist patterns as masks, and removing the photoresist patterns from the semiconductor substrate. The photoresist patterns expose the at least one portion of the peripheral gate patterns.

Methods of forming a static random access memory (SRAM) device according to further embodiments of the invention include providing a semiconductor substrate having at least one cell active region in a cell array region and a plurality of peripheral active regions in a peripheral circuit region, forming sequentially stacked cell gate patterns on the active region in the cell array region and peripheral gate patterns on the active regions in the peripheral circuit region, forming an etch stop layer on the peripheral gate patterns and portions of cell gate patterns, and forming a protective interlayer-insulating layer on the etch stop layer and isolating the cell gate patterns from each other. At least one portion of the peripheral gate patterns and the semiconductor substrate near the at least one portion of the peripheral gate patterns in the peripheral circuit region are exposed, and metal silicide layers are formed on the at least one portion of the peripheral gate patterns and on the semiconductor substrate near the at least one portion of the peripheral gate patterns. Etching protective layer patterns and buried layer patterns are formed on the metal silicide layers.

Forming the etching protective layer patterns and the buried layer patterns may include forming an etching protective layer and a buried layer on the protective interlayer-insulating layer on the at least one portion of the peripheral gate patterns, and performing a planarization process on the buried layer and the etching protective layer until the protective interlayer-insulating layer is exposed. A distance between a top surface of the buried layer and a top surface of the protective interlayer-insulating layer in the peripheral circuit region is larger than a distance between top surfaces of two cell gate patterns facing each other in the cell array region.

Forming the metal silicide layers may include forming a metal layer on the protective interlayer-insulating layer on the at least one portion of the peripheral gate patterns and the semiconductor substrate near the at least one portion of the peripheral gate patterns, and performing a silicide process on the metal layer at least one time.

The metal layer may include nickel (Ni) and/or cobalt (Co).

Forming the metal silicide layers may include sequentially forming a metal layer and a metal protective layer on the protective interlayer-insulating layer on the at least one portion of the peripheral gate patterns and the semiconductor substrate near the at least one portion of the peripheral gate patterns, and performing a silicide process on the metal protective layer at least one time.

The metal layer may include nickel (Ni) and/or cobalt (Co). The metal protective layer may include titanium nitride (TiN).

Exposing the at least one portion of the peripheral gate patterns may include forming photoresist patterns on the protective interlayer-insulating layer, performing an etching process on the protective interlayer-insulating layer and the etch stop layer using the photoresist patterns as masks, and removing the photoresist patterns from the semiconductor substrate. The photoresist patterns expose the at least one portion of the peripheral gate patterns.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 1:
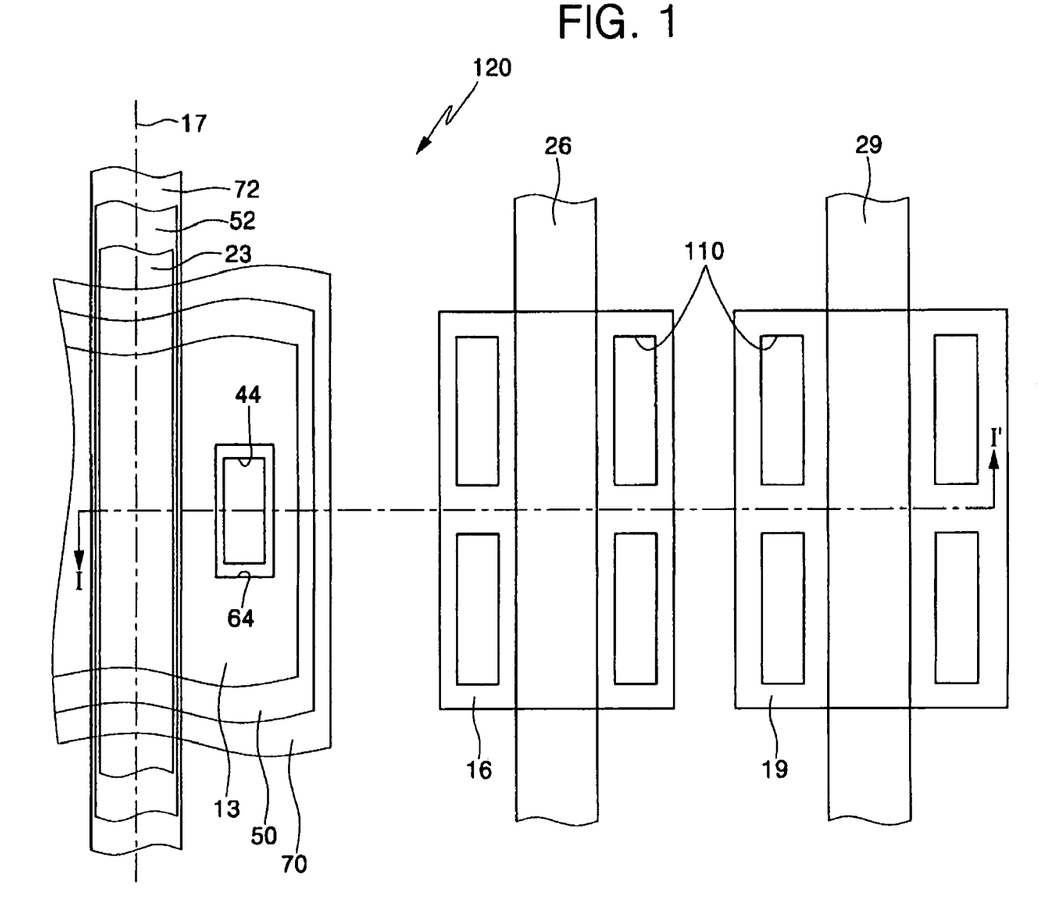
FIG. 1 is a layout diagram showing an SRAM device according to some exemplary embodiments of the present invention.
Figure 2:
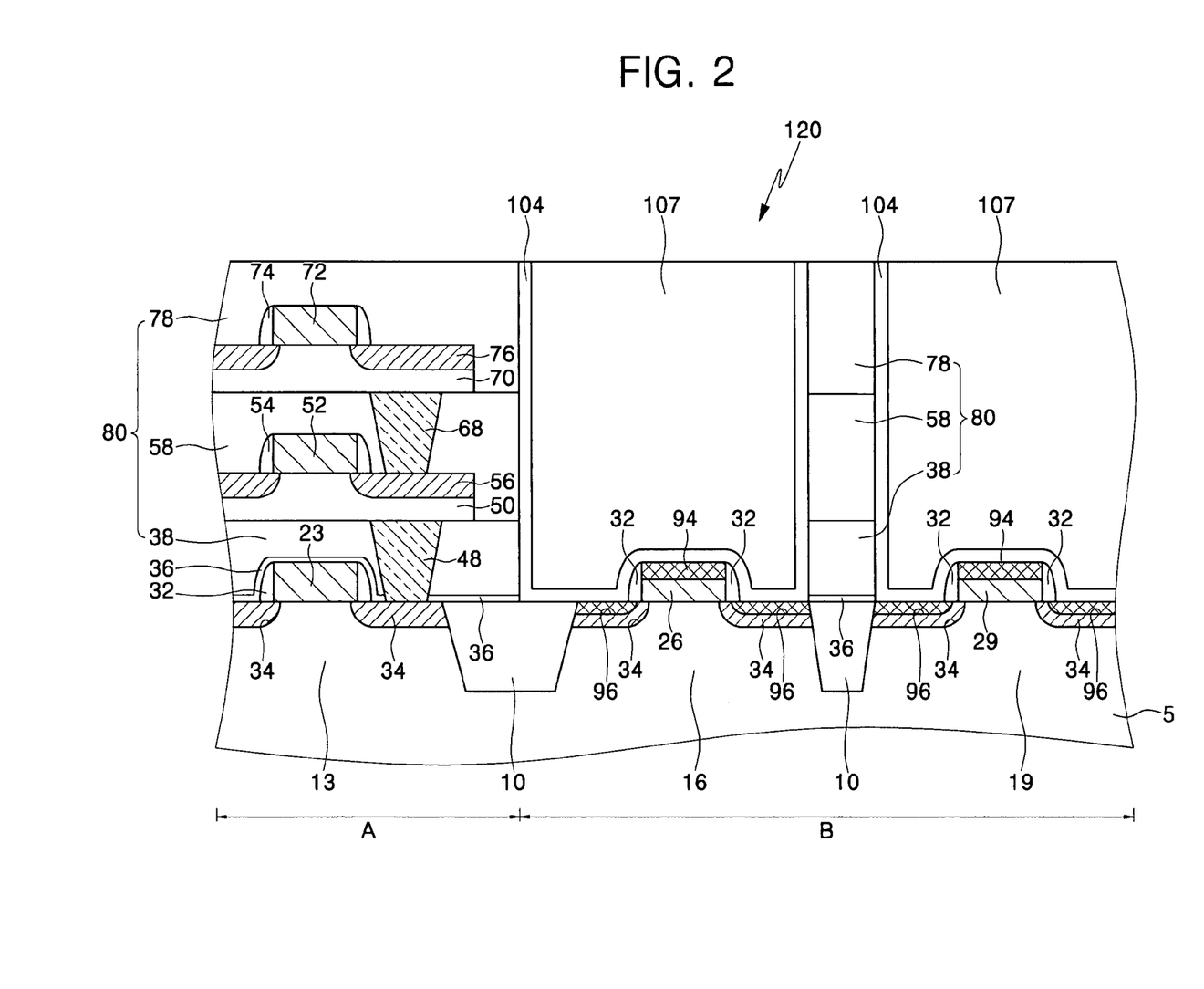
FIG. 2 is a cross-sectional view showing an SRAM device according to some embodiments of the invention taken along line I-I' of FIG. 1.

FIG. 1 is a layout diagram showing an SRAM device 120 according to some exemplary embodiments of the present invention, and FIG. 2 is a cross-sectional view showing an SRAM device taken along line I-I' of FIG. 1.

Referring to FIGS. 1 and 2, a device isolation layer 10 is formed in a cell array region A and a peripheral circuit region B of a semiconductor substrate 5 in which the SRAM device 120 is formed. The device isolation layer 10 isolates at least one cell active region 13 of the cell array region A and peripheral active regions 16 and 19 of the peripheral circuit region B. First, second, and third cell gate patterns 23, 52 and 72 are disposed on the at least one cell active region 13 of the cell array region A. The first to third cell gate patterns 23, 52 and 72 may be sequentially stacked along a line 17 crossing over the semiconductor substrate 5 within the at least one cell active region 13 of the cell array region A. Peripheral gate patterns 26 and 29 are formed on the peripheral active regions 16 and 19 of the peripheral circuit region B, respectively. The peripheral gate patterns 26 and 29 are disposed in a two dimensional arrangement on the peripheral circuit region B of the semiconductor substrate 5. The peripheral gate patterns 26 and 29 and the first to and third cell gate patterns 23, 52 and 72 may include doped polysilicon having a conductivity type (e.g. n-type or p-type).

The cell array region A includes first and second body regions 50 and 70 formed on surfaces of the semiconductor substrate 5 within the at least one cell active region 13. The first and second body regions 50 and 70 may have the same conductivity type as the at least one cell active region 13. The first gate pattern 23 is disposed on the at least one cell active region 13, and the remaining cell gate patterns are disposed on the first and second body regions 50 and 70, respectively. First gate spacers 32 may be disposed on sidewalls of the first cell gate pattern 23 and the peripheral gate patterns 26 and 29. Second and third gate spacers 54 and 74 may be disposed on sidewalls of the second and third cell gate patterns 52, 72

Metal silicide layers 94 and 96 are disposed on at least one portion of the peripheral gate patterns 26 and 29 and on the semiconductor substrate 5 near the peripheral gate patterns 26 and 29. The metal silicide layers 94 and 96 may include cobalt (Co) and/or nickel (Ni) silicide. Buried layer patterns 107 are disposed on the peripheral gate patterns 26 and 29 and on the semiconductor substrate 5 near the peripheral gate patterns 26 and 29 to cover the metal silicide layers 94 and 96 and the semiconductor substrate 5. The buried layer patterns 107 may include an insulating layer having the same or similar etching ratio as the device isolation layer 10. A protective interlayer-insulating layer 80 and an etch stop layer 36 are disposed to surround the buried layer patterns 107. To accomplish this, the protective interlayer-insulating layer 80 and the etch stop layer 36 may be sequentially formed on the cell array region A and the peripheral circuit region B to partially cover the semiconductor substrate 5.

In some other embodiments of the present invention, etching protective layer patterns 104 and buried layer patterns 107 may be sequentially disposed on the peripheral gate patterns 26 and 29, and on the semiconductor substrate 5 near the peripheral gate patterns 26 and 29 to cover the metal silicide layers 94 and 96 and the semiconductor substrate 5. The etching protective layer patterns 104 may have different etching ratios from the buried layer patterns 107 and the protective interlayer-insulating layer 80. In this case, the protective interlayer-insulating layer 80 and the etch stop layer 36 are also disposed to surround the buried layer patterns 107 and the etching protective layer patterns 104. The etching protective layer patterns 104 are interposed between the buried layer patterns 107 and the protective interlayer-insulating layer 80, respectively, and extend upward and away from a top surface of the semiconductor substrate 5. The protective interlayer-insulating layer 80 may include an insulating layer having a different etching ratio from the etch stop layer 36. The protective interlayer-insulating layer 80 may include an insulating layer having the same etching ratio as the buried layer patterns 107. The protective interlayer-insulating layer 80 may include an insulating layer having a different etching ratio from the buried layer patterns 107.

The protective interlayer-insulating layer 80 includes first to third insulating layers 38, 58 and 78. The first to third insulating layers 38, 58 and 78 are disposed on the first, second, and third cell gate patterns 23, 52 and 72 within the cell array region A, respectively. The first to third insulating layers 38, 58 and 78 may be sequentially disposed between the peripheral active regions 16 and 19 in the peripheral circuit region B. The first to third interlayer-insulating layers 38, 58 and 78 may have a same or similar etching ratio. The protective interlayer-insulating layer 80 may include at least two insulating layers.

First source and drain regions 34 are disposed in the at least one cell active region 13 of the cell array region A and the peripheral active regions 16 and 19 of the peripheral circuit region B. The first source and drain regions overlap the first cell and peripheral gate patterns 23, 26, 29. Second source and drain regions 56 are disposed in the first body region 50 of the cell array region A. The second source and drain regions 56 overlap the second cell gate pattern 52. Third source and drain regions 76 are disposed in the second body region 70 of the cell array region A. The third source and drain regions 76 overlap the third cell gate pattern 72.

First and second landing pads 48 and 68 are disposed between the at least one cell active region 13 and the first body region 50, and between the first body region 50 and the second body region 70 in the cell array region A, respectively. The first and second landing pads 48 and 68 are in contact with one of the first source and drain regions 34 of the at least one cell active region 13, and one of the second source and drain regions 56 of the first active region 50, respectively.

Metal contacts 110 may be disposed above the first source and drain regions 34 of the peripheral active regions 16 and 19 in the peripheral circuit region B, as shown in FIG. 1. The metal contacts 110 may penetrate the buried layer patterns 107, or sequentially penetrate the protective interlayer-insulating layer 80 and the etch stop layer 36, to contact the first source and drain regions 34. Additionally and/or alternatively, the metal contacts 110 may sequentially penetrate the buried layer patterns 107 and the etching protective layer patterns 104, or the protective interlayer-insulating layer 80 and the etch stop layer 36, to contact the first source and drain regions 34.

Methods of forming SRAM devices having buried layer patterns according to some embodiments of the present invention will now be described with reference to the accompanying drawings.

FIGS. 3 to 9 are cross-sectional views illustrating methods of forming SRAM devices taken along line I-I' of FIG. 1, respectively.

Figure 3:
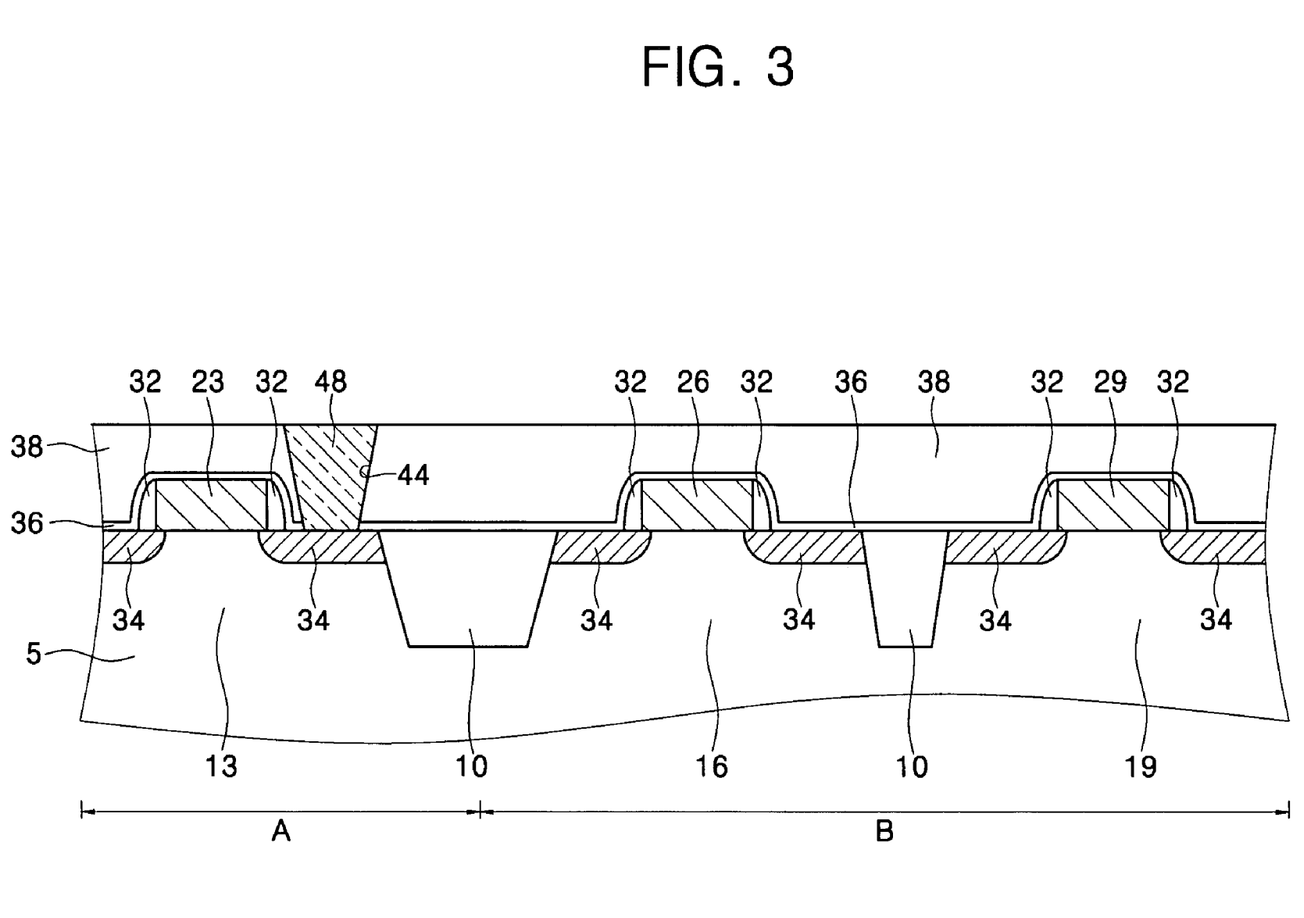
FIGS. 3 to 9 are cross-sectional views illustrating methods of forming an SRAM device according to some embodiments of the invention taken along line I-I' of FIG. 1, respectively.

Referring to FIGS. 1 and 3, a semiconductor substrate 5 having a cell array region A and a peripheral circuit region B is provided. The device isolation layer 10 is formed in the cell array region A and the peripheral circuit region B of the semiconductor substrate 5. The device isolation layer 10 isolates at least one cell active region 13 of the cell array region A and peripheral active regions 16 and 19 of the peripheral circuit region B. A first cell gate pattern 23 and peripheral gate patterns 26 and 29 are formed on the at least one cell active region 13 and the peripheral active regions 16 and 19, respectively. The first cell gate pattern 23 and the peripheral gate patterns 26 and 29 may be formed of doped polysilicon having the same conductivity type as one another.

First gate spacers 32 are formed on sidewalls of the first cell gate pattern 23 and the peripheral gate patterns 26 and 29. The first gate spacers 32 may be formed of an insulating material having a different etching ratio from the device isolation layer 10. The first gate spacers 32 may be formed of silicon nitride ($Si_3N_4$). Alternatively, the gate spacers 32 may be formed of an insulating layer having the same etching ratio as the device isolation layer 10, for example, silicon oxide ($SiO_2$).

An etch stop layer 36 and a first interlayer-insulating layer 38 are sequentially formed to cover the device isolation layer 10 along with the first gate spacers 32, the first cell gate pattern 23 and the peripheral gate patterns 26 and 29. A first landing hole 44 is then formed at a side of the first cell gate pattern 23 in the cell array region A. The first landing hole 44 penetrates the first interlayer-insulating layer 38 and the etch stop layer 36 to expose one of first source and drain regions 34. A first landing pad 48 is formed to fill the first landing hole 44. The first landing pad 48 may have the same conductivity type as the first source and drain regions 34. A selective epitaxial growth (SEG) technique may be performed using the at least one cell active region 13 as a seed to form the landing first pad 48.

The peripheral gate patterns 26 and 29 of the peripheral circuit region B may have different conductivity types from each other. While the peripheral gate patterns 26 and 29 have different conductivity types from each other, the first source and drain regions 34 of the peripheral active regions 16 and 19 in the peripheral circuit region B may have the same conductivity types, corresponding respectively to the peripheral gate patterns 26 and 29.

Figure 4:
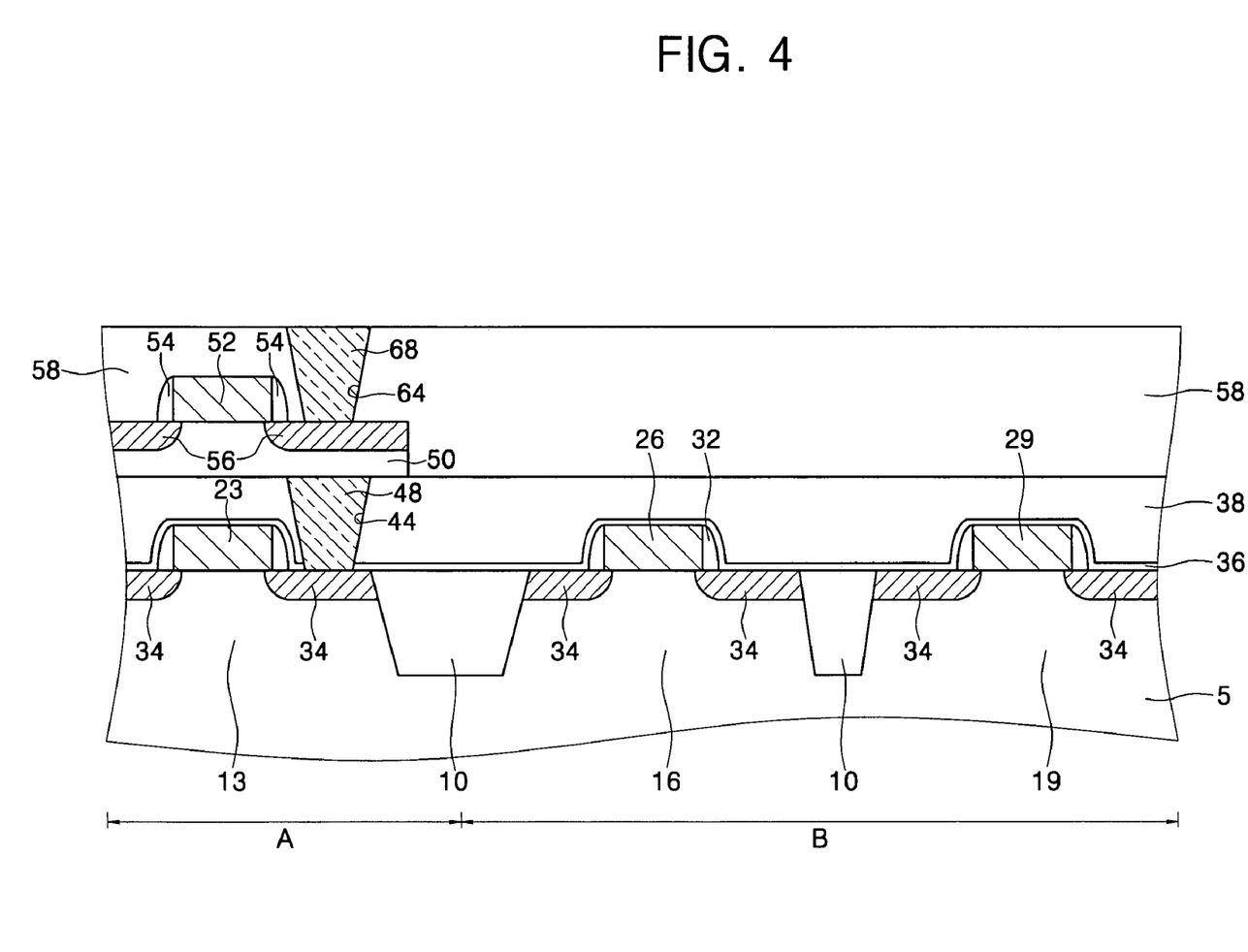

Referring to FIGS. 1 and 4, a first body region 50 is formed on the first interlayer-insulating layer 38 to be in contact with the first landing pad 48. The first body region 50 may have the same conductivity type as the at least one cell active region 13 of the semicondcutor substrate 5. A second cell gate pattern 52 is formed on the first body region 50. The second cell gate pattern 52 may be formed of doped polysilicon having the same conductivity type as the first cell gate pattern 23. Second gate spacers 54 are formed on sidewalls of the second cell gate pattern 52. The second gate spacers 54 may be formed of insulating layers having the same etching ratio as the first gate spacers 32.

Second source and drain regions 56 are formed to overlap the second cell gate pattern 52. The second source and drain regions 56 may have the same conductivity type as the first source and drain regions 34. A second interlayer-insulating layer 58 is formed on the first interlayer-insulating layer 38 to cover the second gate spacers 54, the second cell gate pattern 52, and the first body region 50. The second interlayer-insulating layer 58 may be formed of an insulating layer having the same etching ratio as the first interlayer-insulating layer 38.

A second landing hole 64 is formed to penetrate the second interlayer-insulating layer 58, and to expose one of the second source and drain regions 56. Second landing pad 68 is formed to fill the landing hole 64. The second landing pad 68 may have the same conductivity type as the second source and drain regions 56. A SEG technique may be performed using the second active region 50 as a seed to form the second landing pad 68.

Methods of forming the first body region 50 include forming an amorphous silicon layer on the first interlayer-insulating layer 38, and annealing the amorphous silicon layer at a sufficient temperature and for a sufficient time to form a crystalline silicon layer, and patterning the crystalline silicon layer.

Figure 5:
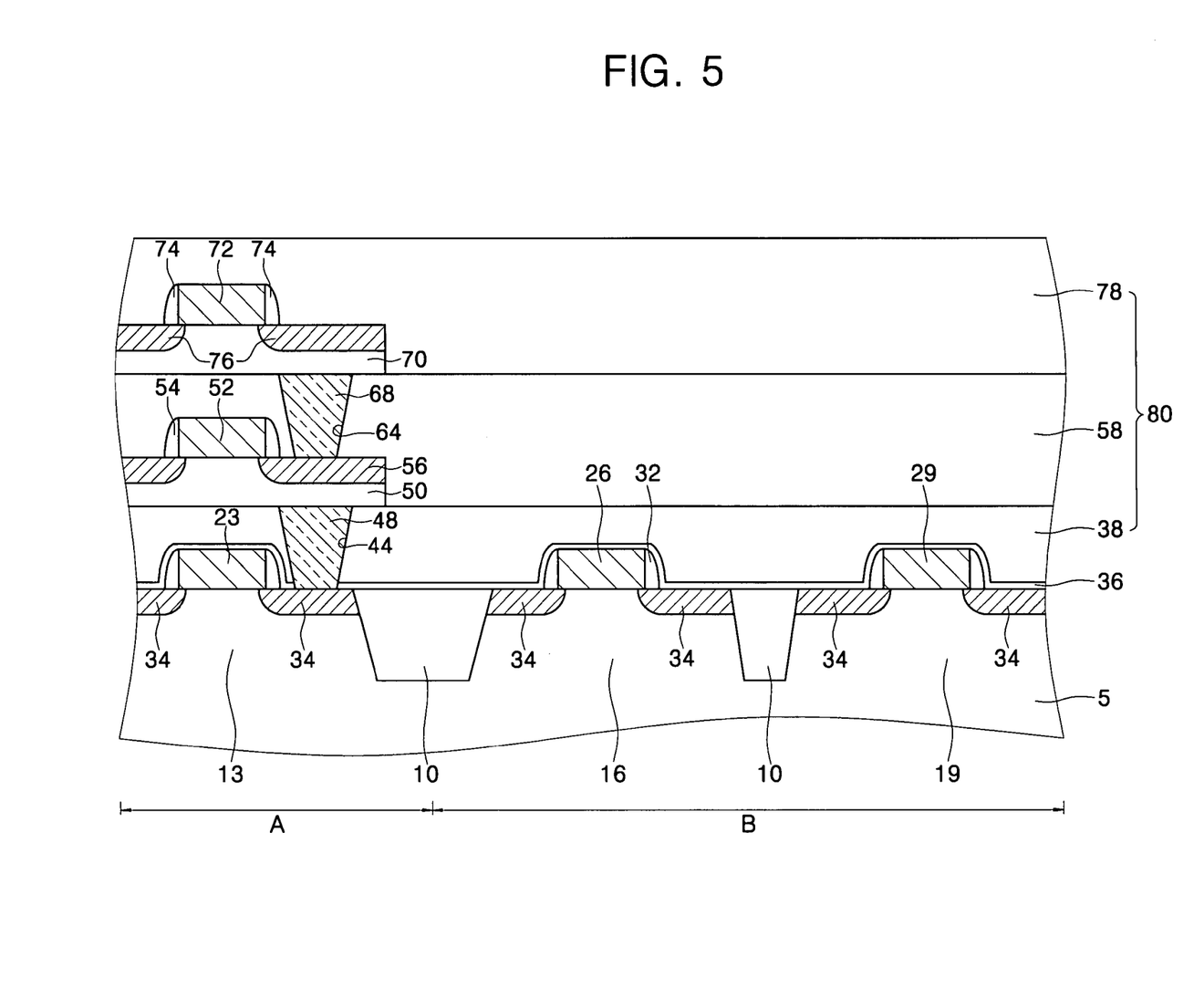

Referring to FIGS. 1 and 5, a second body region 70 is formed on the second interlayer-insulating layer 58 to be in contact with the second landing pad 68. A third cell gate pattern 72 is formed on the second body region 70. The third cell gate pattern 72 may be formed of doped polysilicon having the same conductivity type as the second cell gate pattern 52. Third gate spacers 74 are formed on sidewalls of the third cell gate pattern 72. The third gate spacers 74 may be formed of insulating layers having the same etching ratio as the second gate spacers 54.

Third source and drain regions 76 are formed which overlap the third cell gate pattern 72. The third source and drain regions 76 may be formed to have the same conductivity type as the second source and drain regions 56. A third interlayer-insulating layer 78 is formed on the second interlayer-insulating layer 58 to cover the third gate spacers 74, the third cell gate pattern 72, and the second body region 70. The third interlayer-insulating layer 78 may be formed of an insulating layer having the same etching ratio as the second interlayer-insulating layer 58. The first and second interlayer-insulating layers 38 and 58, together with the third interlayer-insulating layer 78, form a protective interlayer-insulating layer 80.

The second body region 70 may be formed by forming an amorphous silicon layer on the second interlayer-insulating layer 58, and annealing the amorphous silicon layer at a sufficient temperature and for a sufficient time to form a crystalline silicon layer, and patterning the crystalline silicon layer.

Figure 6:
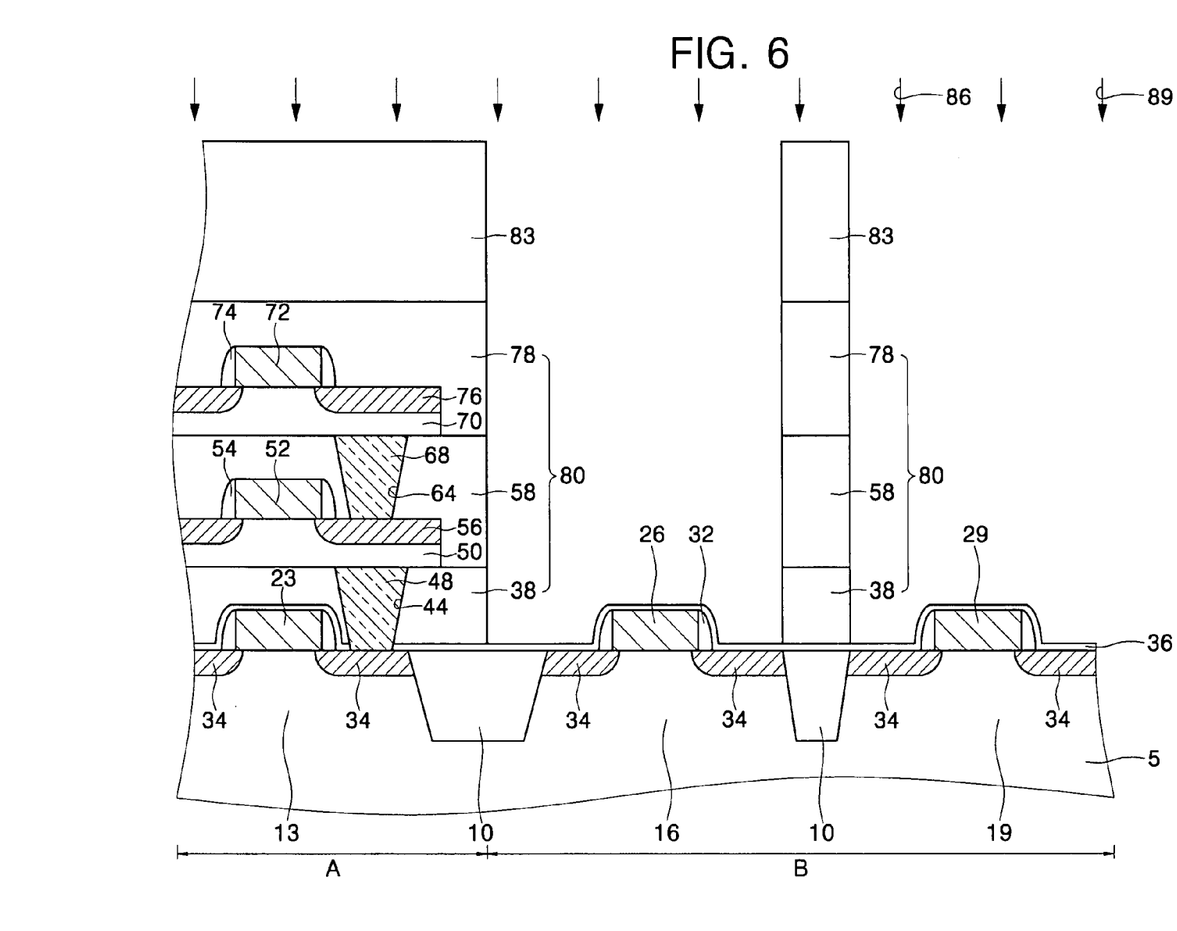
Figure 7:
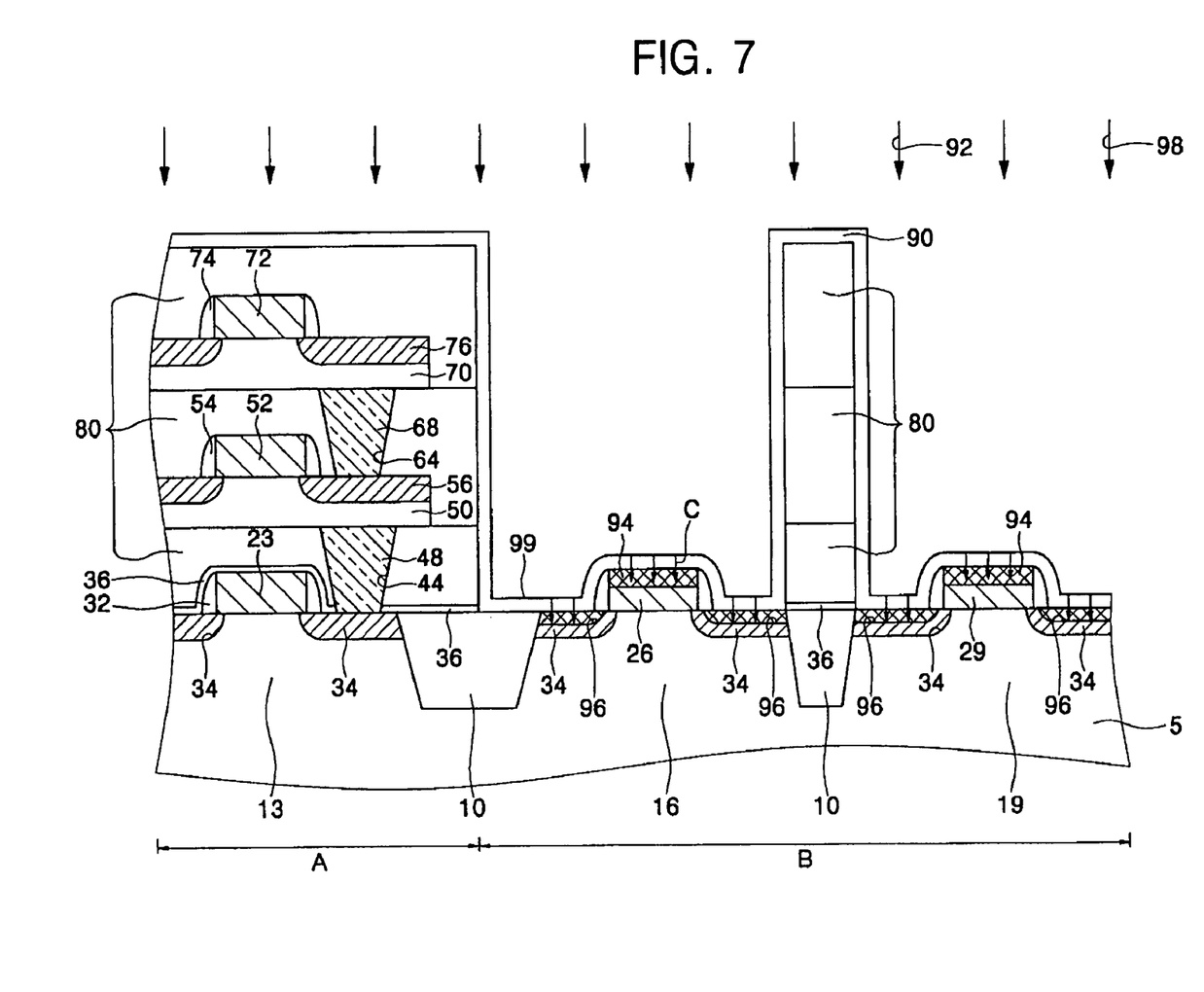

Referring to FIGS. 1, 6, and 7, photoresist patterns 83 are formed on the protective interlayer-insulating layer 80. The photoresist patterns 83 may be formed to cover the cell array region A. In addition, the photoresist patterns 83 may be formed to expose at least one portion of the peripheral gate patterns 26 and 29 and the semiconductor substrate 5 near the peripheral gate patterns 26 and 29. The protective interlayer-insulating layer 80 is etched using the photoresist patterns 83 as an etch mask. The etching process 86 may expose the etch stop layer 36 below the first interlayer-insulating layer 38.

Subsequently, an etching process 89 is performed on the etch stop layer 36 using the photoresist patterns 83 and the protective interlayer-insulating layer 80 as an etch mask. The etching process 89 may remove the etch stop layer 36 on the at least one portion of the peripheral gate patterns 26 and 29 and the semiconductor substrate 5 near the at least one portion of the peripheral gate patterns 26 and 29. After the etch stop layer 36 is removed, the photoresist patterns 83 may be removed from the semiconductor substrate 5.

A metal layer 90 is formed on the at least one portion of the peripheral gate patterns 26 and 29 and the semiconductor substrate 5 near the at least one portion of the peripheral gate patterns 26 and 29 to cover the protective interlayer-insulating layer 80, as shown in FIG. 7. The metal layer 90 may include Ni and/or Co. A silicide process 92 is performed on the metal layer 90 at least one time. The silicide process 92 reacts the metal layer 90 with the at least one portion of the peripheral gate patterns 26 and 29 and the semiconductor substrate 5 near the at least one portion of the peripheral gate patterns 26 and 29, thereby forming metal silicide layers 94 and 96, respectively.

The metal silicide layers 94 and 96 are formed within the first source and drain regions 34 adjacent the peripheral gate patterns 26 and 29. The protective interlayer-insulating layer 80 may substantially prevent the first to third cell gate patterns 23, 52 and 72, the at least one cell active region 13, and the first and second body regions 50 and 70 from being contaminated by metal during the silicide process 92.

After formation of the metal silicide layers 94 and 96, an etching process 98 is subsequently performed on the metal layer 90. In some embodiments of the present invention, a metal protective layer 99 may be formed on the metal layer 90 before the silicide process 92 is performed. The metal protective layer 99 may be formed of titanium nitride (TiN). The metal protective layer 99 can stabilize the silicide process while the metal silicide layers 94 and 96 are formed.

Figure 8:
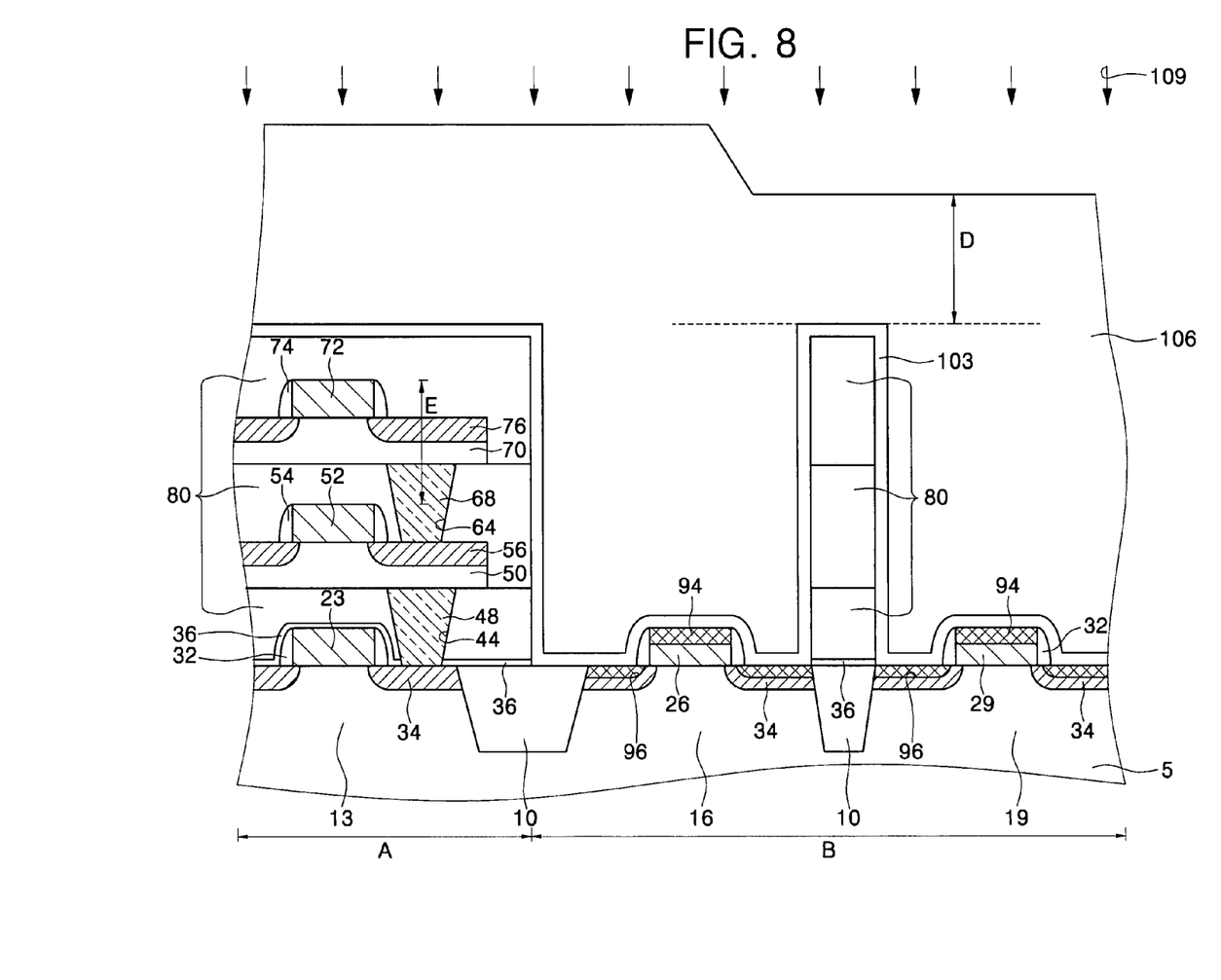
Figure 9:
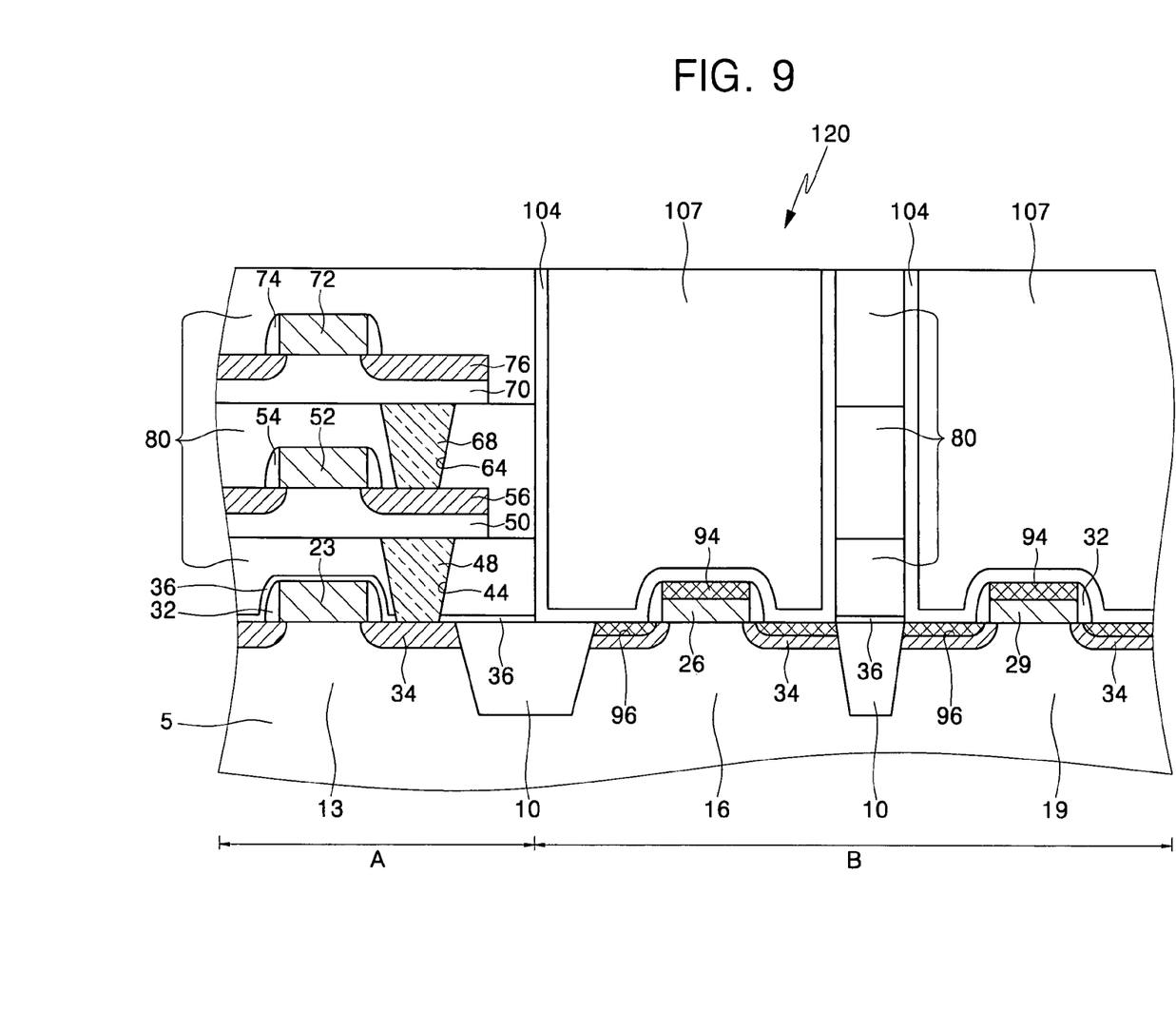

Referring to FIGS. 1, 8, and 9, the etching process 98 removes the portions of the metal layer 90 that do not react with the at least one portion of the peripheral gate patterns 26 and 29 and the semiconductor substrate 5 near the at least one portion of the peripheral gate patterns 26 and 29. A buried layer 106 is formed on the at least one portion of the peripheral gate patterns 26 and 29 and the semiconductor substrate 5 near the at least one portion of the peripheral gate patterns 26 and 29 to cover the protective interlayer-insulating layer 80. The buried layer 106 may be formed of an insulating layer having a different etching ratio from the protective interlayer-insulating layer 80. However, in some embodiments, the buried layer 106 may be formed of an insulating layer having the same etching ratio as the protective interlayer-insulating layer 80.

As shown in FIG. 8, a distance D between a top surface of the buried layer 106 and a top surface of the protective interlayer-insulating layer 80 of the peripheral circuit region B may be formed larger than a distance E between top surfaces of the second and third cell gate patterns 52 and 72 facing each other in the cell array region A. Subsequently, a planarization process 109 is performed on the buried layer 106 until the protective interlayer-insulating layer 80 is exposed. The planarization process 109 may be performed, for example, using a chemical mechanical polishing (CMP) and/or an etchback technique. Buried layer patterns 107, which are surrounded by the protective interlayer-insulating layer 80 and the etch stop layer 36, are formed on the semiconductor substrate 5 as a result of the planarization process 109, as shown in FIG. 9.

In some embodiments of the present invention, an etching protective layer 103 may be formed below the buried layer 106 before the buried layer 106 is formed on the protective interlayer-insulating layer 80, as shown in FIG. 8. The etching protective layer 103 may have a different etching ratio from the buried layer 106 and the protective interlayer-insulating layer 80. In that case, the planarization process 109 may be sequentially performed on the buried layer 106 and the etching protective layer 103 until the protective interlayer-insulating layer 80 is exposed. The planarization process 109 forms the buried layer patterns 107 and the etching protective layer patterns 104, which are surrounded by the protective interlayer-insulating layer 80 and the etch stop layer 36, on the semiconductor substrate 5, as shown in FIG. 9. Accordingly, an SRAM device 120 having the buried layer patterns 107 is formed.

In addition, metal contacts 110 may be formed on the first source and drain regions 34 of the peripheral active regions 16 and 19 in the peripheral circuit region B as shown in FIG. 1. The metal contacts 110 may penetrate the buried layer patterns 107, and/or may sequentially penetrate the protective interlayer-insulating layer 80 and the etch stop layer 36 to contact the first source and drain regions 34. Alternatively, the metal contacts 110 may sequentially penetrate the buried layer patterns 107 and the etching protective layer patterns 104, and/or the protective interlayer-insulating layer 80 and the etch stop layer 36 to contact the first source and drain regions 34.

As described the above, some embodiments of the present invention provide techniques for performing a silicide process on at least one portion of a peripheral gate pattern of a peripheral circuit region when cell gate patterns are vertically stacked on a cell array region of a semiconductor substrate. Consequently, some embodiments of the present invention can enhance the electrical characteristics of an SRAM device employing a silicide process.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A static random access memory (SRAM) device, comprising:
   a semiconductor substrate having at least one cell active region in a cell array region and a plurality of peripheral active regions in a peripheral circuit region, wherein the cell array region further comprises first and second body regions sequentially stacked above the at least one cell active region, and wherein the first and second body regions have the same conductivity type as the at least one cell active region;
   a plurality of stacked cell gate patterns in the cell array region, wherein one of the cell gate patterns is formed on the at least one cell active region, and the remaining cell gate patterns are formed on the first and second body regions, respectively;
   a plurality of peripheral gate patterns disposed on the peripheral active regions in the peripheral circuit region;
   metal silicide layers disposed on at least one portion of the peripheral gate patterns and on portions of the semiconductor substrate near the peripheral gate patterns, respectively;
   buried layer patterns disposed on the peripheral gate patterns and on at least a portion of the metal silicide layers and the portions of the semiconductor substrate near the peripheral gate patterns;
   an etch stop layer and a protective interlayer-insulating layer disposed around the peripheral gate patterns and on the cell array region, wherein the protective interlayer-insulating layer and the etch stop layer surround the buried layer patterns;
   source and drain regions disposed in the at least one cell active region and the first and second body regions, wherein the source and drain regions overlap the cell gate patterns;
   a first landing pad disposed between the at least one cell active region and the first body region in the cell array region, and
   a second landing pad disposed between the first body region and the second body region in the cell array region,
   wherein the first landing pad is in contact with at least one of the source and/or drain regions in the at least one cell active region, and wherein the second landing pad is in contact with at least one of the source and/or drain regions in the first body region.

2. The SRAM device of claim 1, wherein the protective interlayer-insulating layer comprises at least two insulating layers disposed between the cell gate patterns in the cell array region and between the peripheral active regions in the peripheral circuit region.

3. The SRAM device of claim 1, further comprising:
   source and drain regions disposed in the peripheral active regions of the peripheral circuit region,
   wherein the source and drain regions in the peripheral active regions overlap the peripheral gate patterns, and portions of the source and drain regions in the peripheral active regions are on the metal silicide layers in the semiconductor substrate.

4. A static random access memory (SRAM) device, comprising:
   a semiconductor substrate having at least one cell active region in a cell array region and a plurality of peripheral active regions in a peripheral circuit region;
   a plurality of cell gate patterns sequentially stacked on the active region in the cell array region;
   a plurality of peripheral gate patterns formed on the active regions in the peripheral circuit region;
   metal suicide layers disposed on at least one portion of the peripheral gate patterns and on the semiconductor substrate near the at least one portion of the peripheral gate patterns, respectively;
   etching protective layer patterns and buried layer patterns disposed on the at least one portion of the peripheral gate patterns and at least partially on the metal silicide layers and the semiconductor substrate; and an etch stop layer and a protective interlayer-insulating layer disposed on the cell array region and on regions around the at least one portion of the peripheral gate patterns, wherein the protective interlayer-insulating layer and the etch stop layer surround the buried layer patterns and the etching protective layer patterns, and the etching protective layer patterns are disposed between the buried layer patterns and the protective interlayer-insulating layer and extend away from a top surface of the semiconductor substrate.

5. The SRAM device of claim 4, wherein the protective interlayer-insulating layer comprises at least two insulating layers disposed between the cell gate patterns in the cell array region and between the peripheral active regions in the peripheral circuit region.

6. The SRAM device of claim 4, wherein the cell array region further comprises first and second body regions stacked above the at least one cell active region, and wherein the first and second body regions have the same conductivity type as the active region, and one of the cell gate patterns is formed on the at least one cell active region, and the remaining cell gate patterns are formed on the first and second body regions, respectively.

7. The SRAM device of claim 6, further comprising:
source and drain regions disposed in the at least one cell active region and the body regions in the cell array region,
wherein the source and drain regions of the at least one cell active region and the body regions overlap the cell gate patterns.

8. The SRAM device of claim 7, further comprising:
a first landing pad disposed between the at least one cell active region and the first body region in the cell array region; and
a second landing pad disposed between the first body region and the second body region in the cell array region;
wherein the first landing pad is in contact with a source and/or drain region in the at least one cell active region and the second landing pad is in contact with a source and/or drain region in the first body region in the cell array region.

9. The SRAM device of claim 4, further comprising:
source and drain regions disposed in the peripheral active regions in the peripheral circuit region,
wherein the source and drain regions overlap the peripheral gate patterns, and portions of the source and drain regions are on the metal silicide layers in the semiconductor substrate.

* * * * *